United States Patent [19]

Goto et al.

[11] Patent Number: 5,528,074
[45] Date of Patent: Jun. 18, 1996

[54] MICROWAVE SEMICONDUCTOR DEVICE AND INTEGRATED CIRCUIT INCLUDING MICROWAVE SEMICONDUCTOR DEVICES

[75] Inventors: Kei Goto; Takayuki Katoh, both of Itami, Japan

[73] Assignee: Mitsubishi Denki Kabushiki Kaisha, Tokyo, Japan

[21] Appl. No.: 378,748

[22] Filed: Jan. 26, 1995

[30] Foreign Application Priority Data

Feb. 3, 1994 [JP] Japan .................................. 6-011269

[51] Int. Cl.⁶ ............................................ H01L 29/40
[52] U.S. Cl. ...................... 257/664; 257/728; 333/247; 333/248
[58] Field of Search ........................... 257/724, 482, 257/662, 664, 704, 728, 774; 333/33, 246, 247, 248, 254; 361/729, 730, 741

[56] References Cited

U.S. PATENT DOCUMENTS

| 5,049,978 | 9/1991 | Bates et al. ............................. 257/728 |
| 5,206,712 | 4/1993 | Kornrumpf et al. .................... 257/728 |

FOREIGN PATENT DOCUMENTS

| 257870 | 8/1987 | European Pat. Off. ............... 257/728 |
| 563969 | 4/1993 | European Pat. Off. ............... 257/728 |
| 2659184 | 3/1991 | France ................................... 257/728 |
| 1077202 | 9/1987 | Japan ..................................... 257/728 |

*Primary Examiner*—Rolf Hille
*Assistant Examiner*—Minhloan Tran
*Attorney, Agent, or Firm*—Leydig, Voit & Mayer

[57] ABSTRACT

A semiconductor device includes a substrate having a microwave semiconductor element, a microwave transmission line disposed on the substrate and electrically connected to the microwave semiconductor element, and a waveguide terminal structure disposed in the substrate and connected to an end of an external waveguide, wherein an end of a signal conductor of the microwave transmission line is included in the waveguide terminal structure. Input and output of microwave signals between the semiconductor device and an external device are carried out simply by applying an end of the external waveguide to the waveguide terminal structure. As a result, even when the substrate of the semiconductor device warps, an input-output characteristic evaluation of the semiconductor device is carried out with high stability. Further, the microwave signals are transmitted from the external waveguide directly to the microwave transmission line on the substrate or from the microwave transmission line directly to the external waveguide, thereby reducing transmission loss of the microwave signals.

13 Claims, 14 Drawing Sheets

MICROWAVE SEMICONDUCTOR DEVICE AND INTEGRATED CIRCUIT INCLUDING MICROWAVE SEMICONDUCTOR DEVICES

FIELD OF THE INVENTION

The present invention relates to semiconductor devices and hybrid integrated circuit devices and, more particularly, to an improvement of a microwave signal transmission within a semiconductor device or between a semiconductor device and an external device.

BACKGROUND OF THE INVENTION

FIG. 13 is a perspective view illustrating an input part of a conventional high frequency band IC chip (hereinafter referred to as a microwave IC chip) and a coplanar type prober, for explaining an input-output characteristic evaluating test for the conventional microwave IC chip. In the figure, reference numeral 1 designates a microwave IC chip. The IC chip 1 includes a GaAs substrate 10 on which a plurality of circuit elements, such as FETs (not shown), are present. A signal conductor 11 is disposed on the front surface of the substrate 10, and a metallized layer 10c for grounding is disposed on the rear surface of the substrate 10. The signal conductor 11 and the metallized layer 10c make a microstrip line 10A for sending microwave signals to the circuit elements. A signal pad 10a is disposed at an end of the signal conductor 11. Grounding pads 10b are disposed on opposite sides of the signal pad 10a and connected to the metallized ground layer 10c via through-holes (not shown). Reference numeral 90 designates a coplanar type wave guide prober. The prober 90 comprises a prober body 9 comprising an insulating substrate, a signal prober line 9a disposed on the surface of the prober body 9, and ground prober lines 9b disposed on opposite sides of the signal prober line 9a. Although FIG. 13 shows the input part of the microwave IC chip, an output part of the IC chip has the same structure as shown in FIG. 13.

A description is given of the operation.

The microwave IC chip 1 is put on a grounded stage (not shown), and the signal prober line 9a and the ground prober lines 9b of the coplanar type wave guide prober 90 are applied to the signal pad 10a and the ground pads 10b of the IC chip 1, respectively. In this state, microwave signals are input to the IC chip 1 to operate the IC chip 1, and the microwave signals output from the output part (not shown) are probed with a coplanar type wave guide prober having the same structure as the prober 90.

FIGS. 14, 15(a)–15(c), and 16(a)–16(b) are diagrams for explaining a package used when a microwave IC chip is mounted on a mounting substrate. More specifically, FIG. 14 is a perspective view, partly broken away, illustrating external and internal structures of the package. FIG. 15(a) is a plan view illustrating a rear surface of the package, FIG. 15(b) is a side view of the package, and FIG. 15(c) is a sectional view of the package taken along a line 15c—15c of FIG. 15(a). FIGS. 16(a) and 16(b) are a perspective view and a side view for explaining a method of mounting a microwave IC chip included in the package.

In these figures, reference numeral 500 designates a surface mountable package. The package 500 comprises a package body 501 having a surface on which a microwave IC chip 1 is disposed, and a lid 590 covering the IC chip 1. The package body 501 comprises a ceramic substrate 501a and a ground conductor layer 501b disposed on the rear surface of the ceramic substrate 501a. Portions of the ground conductor layer 501b are removed at opposite ends of the package to form U-shaped gaps 502a and 502b, whereby an input side coplanar line part 550 and an output side coplanar line part 560 are produced, respectively.

More specifically, a portion 552 of the conductor layer 501b surrounded by the U-shaped gap 502a serves as a coplanar signal conductor of the input side coplanar line part 550, and portions 551 and 553 of the conductor layer 501b on opposite sides of the portion 552 serve as ground conductors. Likewise, a portion 562 of the conductor layer 501b surrounded by the U-shaped gap 502b serves as a coplanar signal conductor of the output side coplanar line part 560, and portions 561 and 563 of the conductor layer 501b on opposite sides of the portion 562 serve as ground conductors. The width W of the coplanar signal conductor 552 (562) and the intervals G between the signal conductor 552 (562) and the ground conductors 551 and 553 (561 and 563) are chosen so that characteristic impedance of the coplanar line part 550 (560) is 50 Ω.

The input side signal conductor 552 and the output side signal conductor 562 are connected to an input side signal lead 512 and an output side signal lead 522, respectively. The input side ground conductors 551 and 553 and the output side ground conductors 561 and 563 are connected to input side ground leads 511 and 513 and output side ground leads 521 and 523, respectively. An input side terminal 510 comprises the leads 511, 512, and 513, and an output side terminal 520 comprises the leads 521, 522, and 523. When the package 500 is mounted on a mounting substrate 601 (see FIG. 16(a)), the input and output terminals 510 and 520 are connected to coplanar lines 610 and 620 on the mounting substrate 601, respectively.

On the front surface of the ceramic substrate 501a, conductor layers 503a and 503b are disposed at positions opposite the coplanar signal conductors 552 and 562. The conductor layers 503a and 503b serve as strip signal conductors of input and output side microstrip line parts 570 and 580, respectively, and portions of the ground conductor layer 501b opposite the respective conductor layers 503a and 503b serve as ground conductors of the input and output side microstrip line parts 570 and 580, respectively, using the ceramic substrate 501a as a dielectric. The width of the strip signal conductor 503a (503b) and the thickness and dielectric constant of the ceramic substrate 501a are appropriately chosen so that the characteristic impedance of the microstrip line part 570 (580) is 50 Ω. The ceramic substrate 501a has through-holes 504a and 504b filled with a conductive material. The through-holes 504a and 504b connect the strip signal conductors 503a and 503b on the front surface of the ceramic substrate to the coplanar signal conductors 552 and 562 on the rear surface of the ceramic substrate, respectively.

A plurality of through-holes 505 filled with a conductive material are located in a region of the ceramic substrate 501a where the microwave IC chip 1 is disposed. When the IC chip 1 is disposed on that region of the ceramic substrate 501a, a ground conductor 1a of the IC chip 1 is connected to the ground conductor layer 501b on the rear surface of the package via the through-holes 505.

A description is given of a method of mounting the package 500 on the mounting substrate 601. Initially, the microwave IC chip 1 is adhered to the chip mounting region of the package body 501 with a conductive adhesive or the like, and input and output side electrode pads (not shown) on the surface of the chip 1 are connected to the input and output side strip signal conductors 503a and 503b by bonding wires 2a and 2b, respectively. Thereafter, the lid 590 is put on the package body 501 so as to cover the IC chip 1 and adhered to the package body with an adhesive or the like, whereby the IC chip 1 is hermetically sealed in the package 500.

Then, as illustrated in FIG. 16(a), the microwave IC package 500 is mounted on the mounting substrate 601. Preferably, a glass-epoxy substrate is employed as the mounting substrate 601. On a region of the mounting substrate 601 where the package 500 is to be disposed, a signal supply side coplanar line 610 for supplying microwave signals to the microwave IC chip 1 and a signal transmission side coplanar line 620 for transmitting the microwave signals from the IC chip 1 toward the latter stage are disposed. The signal supply side coplanar line 610 and the signal transmission side coplanar line 620 are connected to the input and output terminals 510 and 520 of the package 500, respectively.

More specifically, when the package 500 is put at a prescribed position of the mounting substrate 601, the signal lead 512 of the input terminal 510 of the package 500 contacts the signal conductor 612 of the signal supply side coplanar line 610 while the signal lead 522 of the output terminal 520 contacts the signal conductor 612 of the signal transmission side coplanar line 620. In addition, the ground leads 511 and 513 of the input terminal 510 contact the ground conductors 611 and 613 of the signal supply side coplanar line 610, respectively, while the ground leads 521 and 523 of the output terminal 520 contact the ground conductors 621 and 623 of the signal transmission side coplanar line 620, respectively. The respective contacting parts are fixed with solder or the like, whereby the microwave IC package 500 is mounted on the mounting substrate 601.

As illustrated in FIG. 16(b), another microwave IC package is mounted on the rear surface of the mounting substrate 601 in the same manner as described above. In this way, microwave IC packages are mounted on both surfaces of the mounting substrate 601, resulting in a high-density hybrid IC.

Meanwhile, Japanese Published Patent Application No. Hei. 2-106707 discloses a hybrid IC in which an end of a microstrip line on a mounting substrate is used as a terminal for an I/O interface with an external circuit.

In the high-frequency IC package 500 mounted on the mounting substrate 601, a microwave input applied to the input terminal 510 from the signal supply side coplanar line 610 on the mounting substrate 601 travels through the input side coplanar line part 550 on the rear surface of the package body and the through-hole 504a and reaches the input side microstrip line part 570 on the front surface of the package body. Further, the microwave input travels through the bonding wire 2a and reaches the microwave IC chip 1.

The microwave input is subjected to prescribed signal processing according to a function of the IC chip, for example, amplification, switching, or phase modification, and then it is output from the IC chip 1. The microwave output travels through the bonding wire 2b, the output side microstrip line part 580, and the through-hole 504b to reach the output side coplanar line part 560 on the rear surface of the package body. Then, it is output from the output terminal 520 of the package 500 to the signal transmission side coplanar line 620 of the mounting substrate 601.

The input-output characteristics of the microwave IC chip 1 are evaluated as described above. However, when the substrate 10 of the microwave IC chip 1 warps as shown in FIG. 13, the signal prober line 9a and the ground prober lines 9b of the prober 90 are not in perfect contact with the signal pad. 10a and the ground pads lob of the IC chip 1, respectively, so that a stable evaluation is not carried out.

Further, in the microwave IC package 500 shown in FIG. 14, the signal pad 10a and the ground pads 10b (see FIG. 13) of the IC chip 1 are connected to the strip line 503a (503b) by the wires 2a (2b). Since the wires 2a and 2b are not microwave transmission lines, dissipation due to unwanted radiation and reflection occurs at the ends of the wires. Further, the strip signal conductors 503a and 503b on the front surface of the ceramic substrate 501a are connected to the coplanar signal conductors 552 and 562 on the rear surface of the ceramic substrate 501a via the through-holes 504a and 504b filled with a conductive material, respectively. However, the through-holes 504a and 504b merely connect the signal conductors of the microstrip transmission lines on the opposite front and rear surfaces of the ceramic substrate, and a microwave transmission line structure comprising a signal conductor and ground conductors and having a matched characteristic impedance is not achieved. Therefore, dissipation due to unwanted radiation and reflection occurs at the ends of the through-holes.

SUMMARY OF THE INVENTION

An object of the present invention is to provide a semiconductor device operating at a microwave frequency that enables a reliable evaluation of input-output characteristics of the device.

Another object of the present invention is to provide a semiconductor device that performs input and output of microwave signals with an external device without dissipation due to unwanted radiation and reflection.

Still another object of the present invention is to provide a hybrid integrated circuit device that performs input and output of microwave signals with an external device without dissipation due to unwanted radiation and reflection.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a substrate including a microwave semiconductor element, a microwave transmission line disposed on the substrate and electrically connected to the microwave semiconductor element, and a waveguide terminal structure disposed in the substrate and connected to an end of an external waveguide, wherein an end of a signal conductor of the microwave transmission line is included in the waveguide terminal structure. Therefore, input and output of microwave signals between the semiconductor device and an external device are carried out by only applying an end of the external waveguide to the waveguide terminal structure. As a result, even when the substrate of the semiconductor device warps, an input-output characteristic evaluation of the semiconductor device is carried out with high stability. Further, the microwave signals are transmitted from the external waveguide direct to the microwave transmission line on the substrate or from the microwave transmission line direct to the external waveguide, thereby reducing transmission loss of the microwave signals.

According to a second aspect of the present invention, the above-described waveguide terminal structure is located in the substrate so that it is connected to an end of an external waveguide applied to the upper surface of the substrate, and its terminal surface is located within the substrate. Therefore, connection between the waveguide terminal structure of the semiconductor device and the external waveguide is facilitated.

According to a third aspect of the present invention, the above-described external waveguide structure comprises a body part disposed within the substrate so that it is connected to an end of an external waveguide applied to the lower surface of the substrate, and a terminal surface part comprising a material other than the material of the substrate and disposed on the upper surface of the substrate. Therefore, the thickness of the substrate can be selected regardless of the wavelength of the microwave signals traveling through the external waveguide and the microwave transmission line.

According to a fourth aspect of the present invention, the above-described waveguide terminal structure includes a dielectric layer, and an end of an external dielectric waveguide is connected to the dielectric layer. In this case, since the wavelength of the microwave signals in the dielectric layer is shorter than the wavelength of the microwave signals in free space, the size of the waveguide terminal structure is reduced, resulting in a reduction in the size of the semiconductor device.

According to a fifth aspect of the present invention, the above-described microwave transmission line is a coplanar line. Therefore, the thickness of the substrate can be selected regardless of matching of characteristic impedance of the microwave transmission line, resulting in a reduction in the size of the semiconductor device.

According to a sixth aspect of the present invention, a hybrid integrated circuit device includes a plurality of semiconductor chips respectively contained in IC packages and mounted on a mounting substrate. Each of the IC chips includes a substrate in which a microwave semiconductor element is produced, input and output side microwave transmission lines, each including a signal conductor, disposed on the substrate and electrically connected to the microwave semiconductor element, and input and output side waveguide terminal structures disposed at prescribed positions in the substrate. The signal conductors of the input and output side microwave transmission lines of each IC chip are included in the input and output side waveguide terminal structures, respectively, at ends opposite to ends connected to the microwave semiconductor element. The hybrid integrated circuit device further includes a plurality of waveguides connecting the semiconductor chips with each other and transmitting microwave signals between the semiconductor chips. Each of the waveguides has opposite ends respectively connected to the input and output side waveguide terminal structures of the semiconductor chip. In this hybrid integrated circuit device, the transmission of microwave signals between the IC chips is performed only through the waveguides, thereby reducing the transmission loss of the microwave signals.

BRIEF DESCRIPTION OF THE DRAWINGS

FIGS. 7(a)–7(c) are perspective views for explaining an input part of a microwave IC chip in accordance with a third embodiment of the present invention, in which FIG. 7(a) shows the input part and an external waveguide, FIG. 7(b) shows the input part without a metal cap, and FIG. 7(c) shows the metal cap.

DETAILED DESCRIPTION OF THE PREFERRED EMBODIMENTS

[Embodiment 1]

Figure 1:
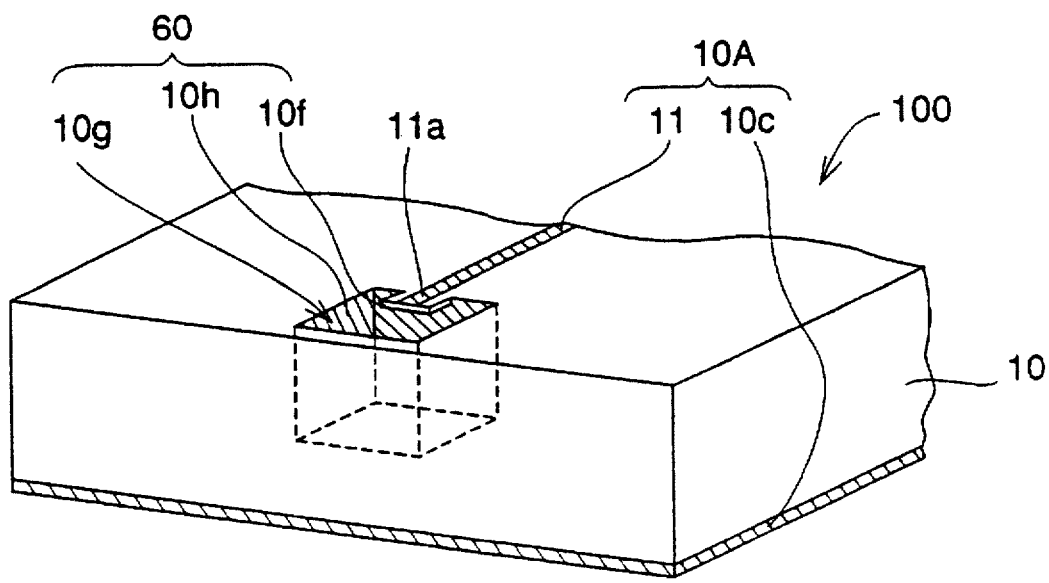
FIG. 1 is a perspective view illustrating an input part of a microwave IC chip in accordance with a first embodiment of the present invention.
Figure 2:
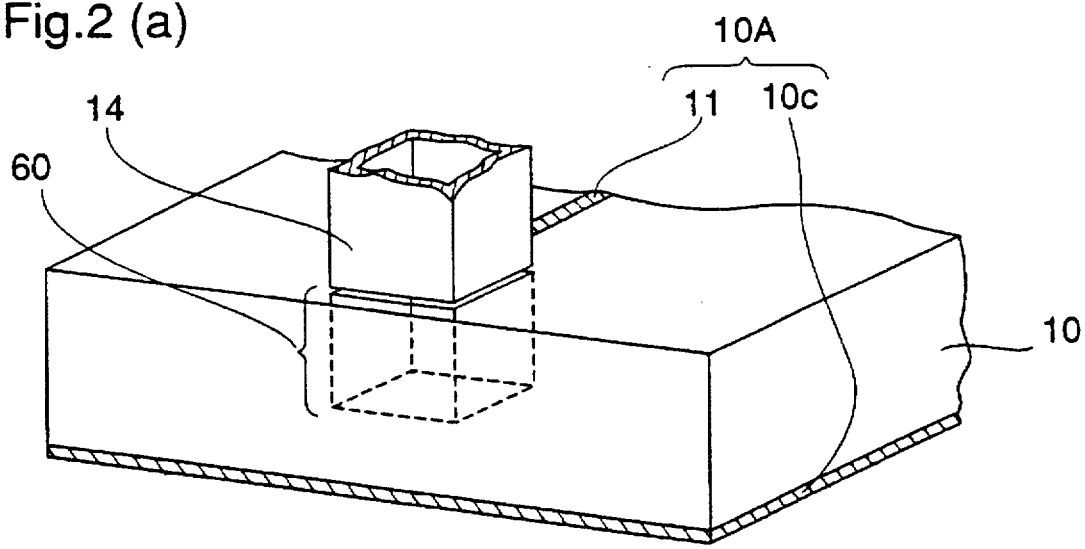
FIG. 2(a) is a perspective view of the input part of the microwave IC chip shown in FIG. 1 in a state where microwave signals are applied.
FIG. 2(b) is a perspective view illustrating an end portion of an external waveguide used for the application of the microwave signals.
Figure 2:
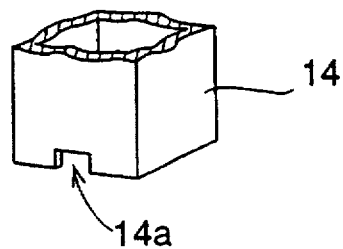
Figure 14:
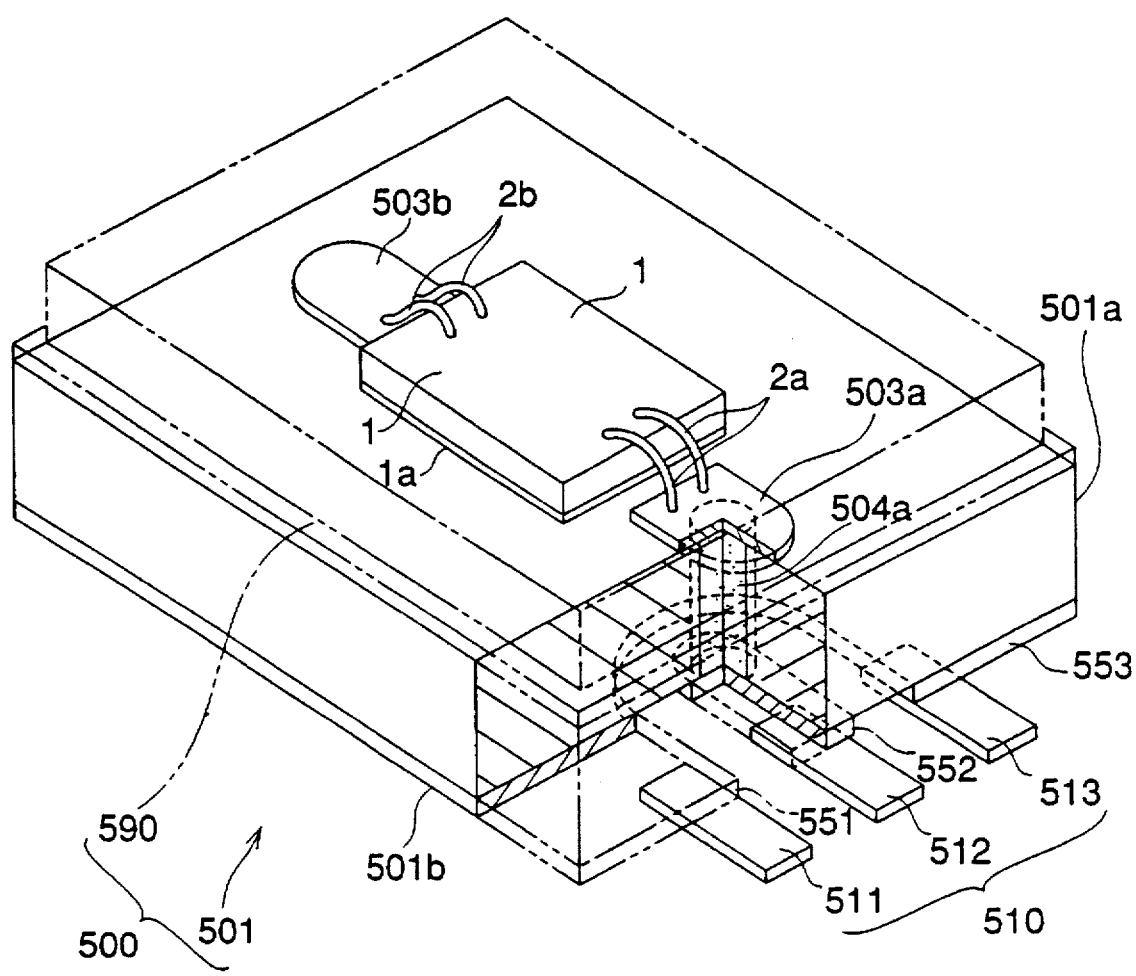
FIG. 14 is a perspective view, partly broken away, illustrating external and internal structures of a package body used when the microwave IC chip shown in FIG. 13 is mounted on a mounting substrate.
Figure 15:
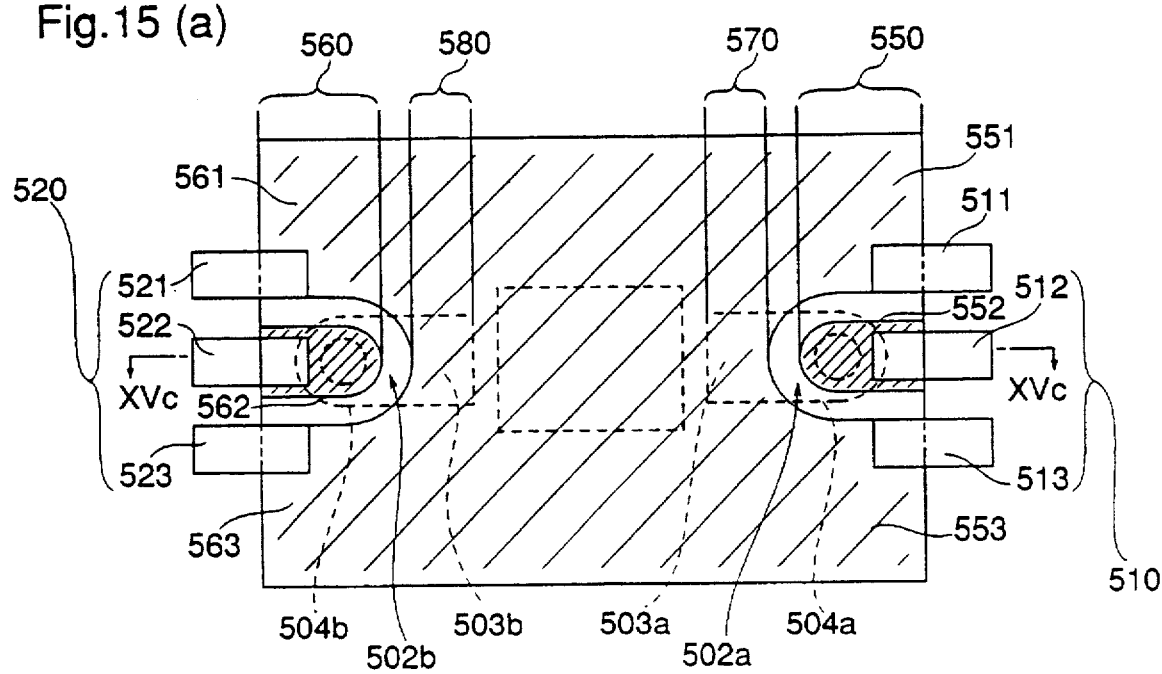
FIG. 15(a) is a plan view illustrating a rear surface of the package shown in FIG. 14.
FIG. 15(b) is a side view of the package.
FIG. 15(c) is a sectional view of the package taken along a line 15c—15c of FIG. 15(a).
Figure 15:
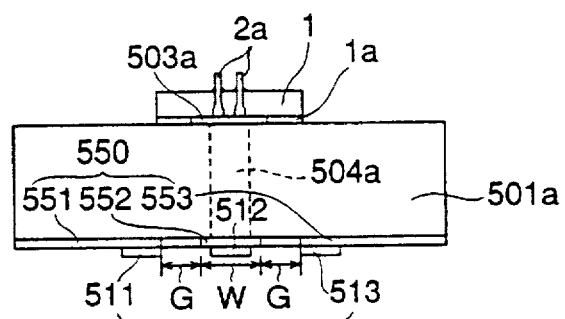
Figure 15:
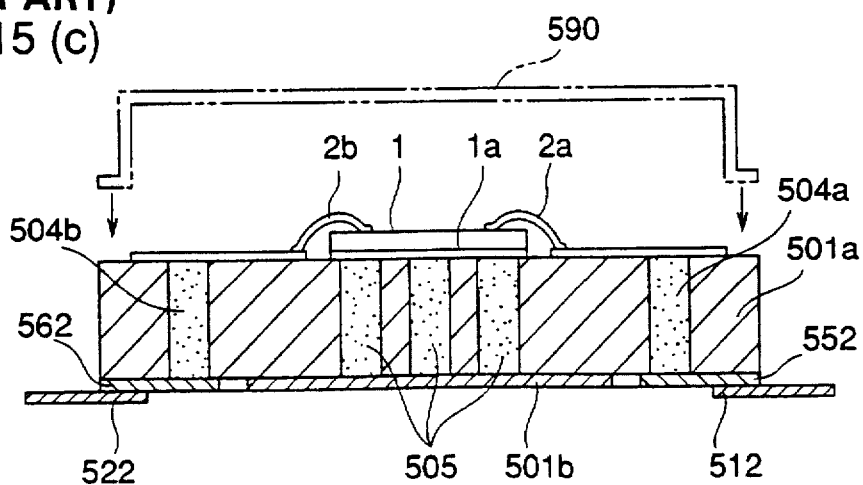
Figure 16:
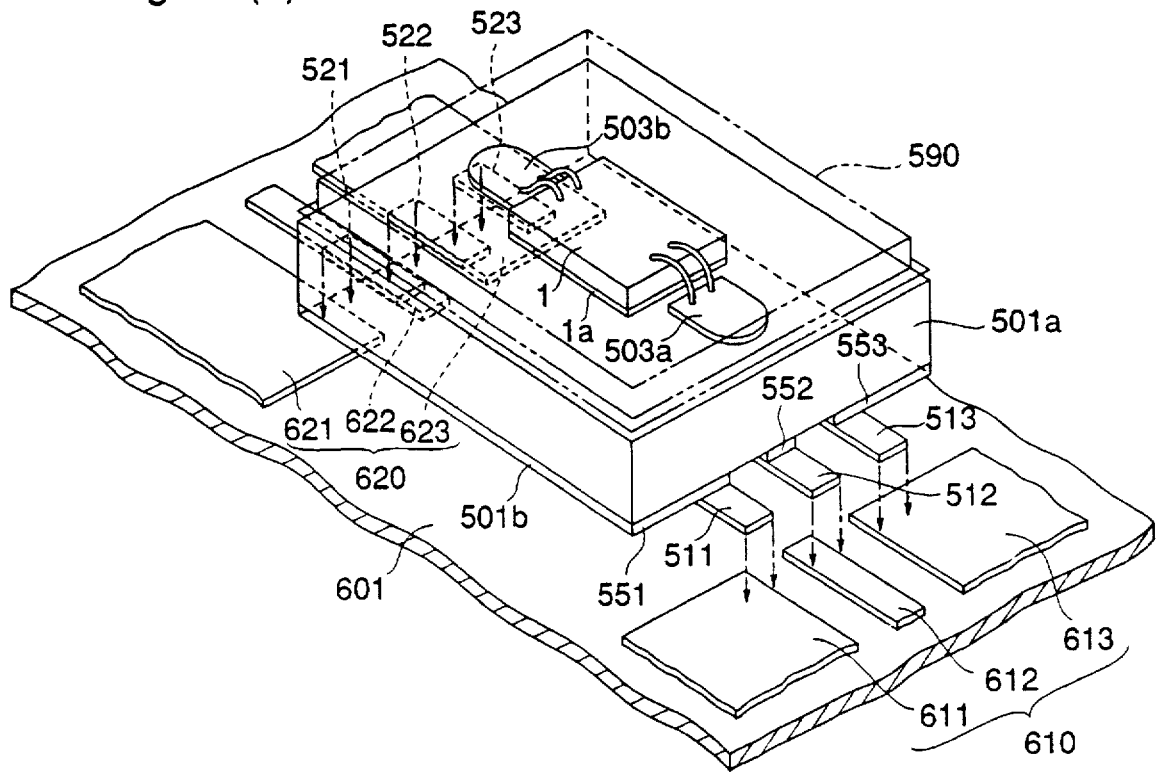
FIGS. 16(a) and 16(b) are a perspective view and a side view for explaining a method of mounting the microwave IC chip shown in FIG. 13 using the package shown in FIG. 14.
Figure 16:
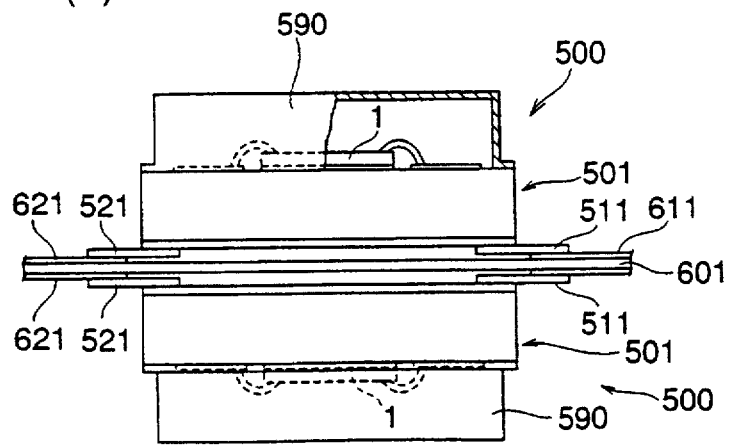

FIG. 1 is a perspective view illustrating an input part of a microwave IC chip according to a first embodiment of the present invention. FIG. 2(a) is a perspective view for explaining the input part when microwave signals are input to the input part of the IC chip, and FIG. 2(b) is a perspective view illustrating an end portion of an external waveguide used when the microwave signals are input to the input part of the IC chip. In these figures, the same reference numerals as in FIG. 14 designate the same or corresponding parts. A microwave IC chip includes a semiconductor substrate 10 comprising GaAs or the like and including a plurality of circuit elements (not shown). A microstrip line 10A comprises a signal conductor 11 disposed on the surface of the substrate 10 and a metallized ground conductor 10c disposed on the rear surface of the substrate 10. The microstrip line 10A transmits microwave signals to the circuit elements. A waveguide terminal structure 60 is located at a prescribed position in the substrate 10. The waveguide terminal structure 60 transmits microwave signals from an external waveguide 14 shown in FIG. 2(a) to the microstrip line 10A.

More specifically, the waveguide terminal structure 60 comprises a hole 10g formed in the substrate 10, a portion 10f of the substrate 10 hanging over the hole 10g (hereinafter referred to as overhanging portion), and a metallized layer 10h covering the inner surface of the hole 10g except the overhanging portion 10f and stopping the hole 10g at a position spaced from the front surface of the substrate 10 by a distance equivalent to one-quarter of the wavelength the microwave signals transmitted through the external waveguide 14. An end portion 11a of the signal conductor 11 of the microstrip line 10A is disposed on the overhanging portion 10f. As shown in FIG. 2(b), the external waveguide 14 has a notch 14a at the edge. When the external waveguide 14 is applied to the waveguide terminal structure 60 of the IC chip 100, the notch 14a is positioned above the end portion 11a of the signal conductor 11. That is, the edge of the external waveguide 14 does not contact the signal conductor 11 but contacts the metallized layer 10h in the hole 10g.

Although only the input part of the IC chip is described, an output part has the same structure as described above. That is, a microstrip line for transmitting microwave signals output from the circuit elements is disposed on the surface of the substrate 10, and a waveguide terminal structure for transmitting the microwave signals traveling through the microstrip line to an external waveguide is connected to an end of the microstrip line.

A description is given of a fabricating method of the waveguide terminal structure 60.

Figure 3:
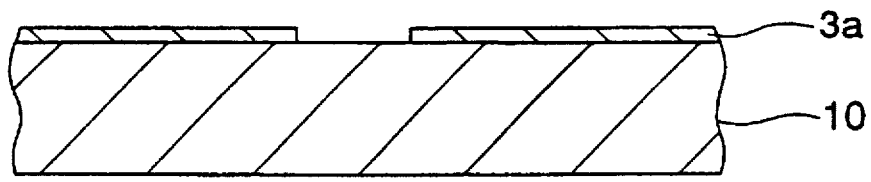
FIGS. 3(a)–3(g) and 4(a)–4(f) are sectional views illustrating process steps in a method of fabricating a waveguide terminal structure of the microwave IC chip shown in FIG. 1.
Figure 3:
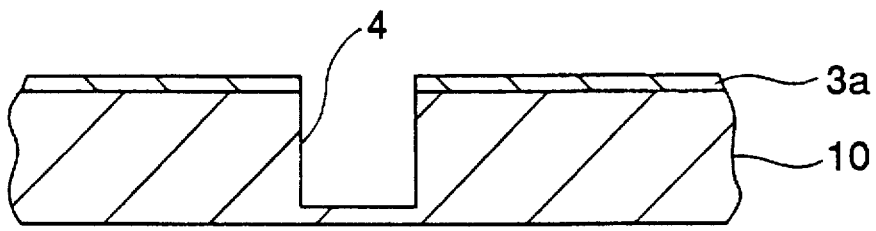
Figure 3:
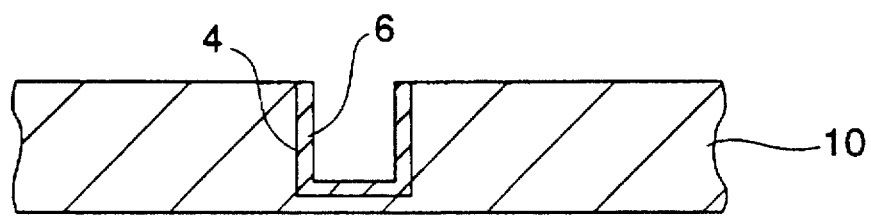
Figure 3:
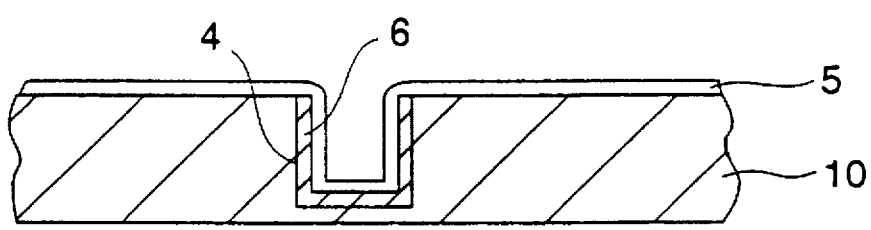
Figure 3:
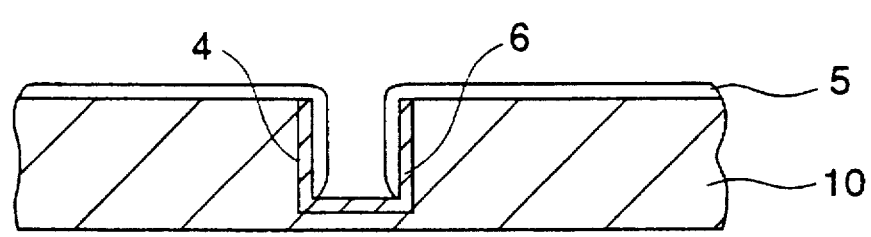
Figure 3:
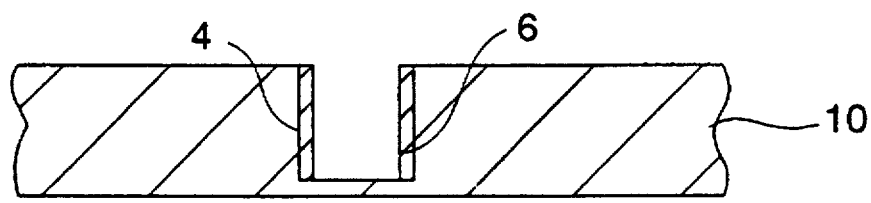
Figure 3:
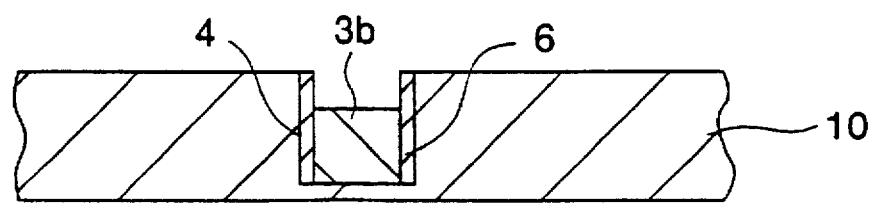

Initially, a resist pattern 3a is formed on the front surface of the substrate 10 (FIG. 3(a)), and the substrate 1 is anisotropically etched using the resist pattern 3a as a mask to form a hole 4 (FIG. 3(b)). The etching time is controlled so that the hole 4 does not penetrate through the substrate 10.

After removal of the resist pattern 3a, an Au film 6 is deposited over the surface of the substrate 10 including the inner surface of the hole 4 by sputtering, and the Au film is selectively etched leaving a portion on the inner surface of the hole 4 (FIG. 3(c)).

Thereafter, an SiO$_2$ film 5 is deposited on the surface of the substrate 10 and on the Au film 6 (FIG. 3(d)), and a portion of the SiO$_2$ film 5 on the bottom of the hole 4 is selectively etched away (FIG. 3(e)).

Using the remaining SiO$_2$ film 5 as a mask, a portion of the Au film 6 on the bottom of the hole 4 is selectively removed by ion milling, followed by etching removal of the SiO$_2$ film 5 (FIG. 3(f)).

In the step of FIG. 3(g), a resist 3b is deposited in the hole 4 to a prescribed thickness so that the distance from the top surface of the deposited resist 3b to the rear surface of the substrate 10 is equivalent to one-quarter of the wavelength ($\lambda$) of the microwave signal. Thereafter, Au is plated over the front surface of the substrate 10 (FIG. 4(a)).

Figure 4:
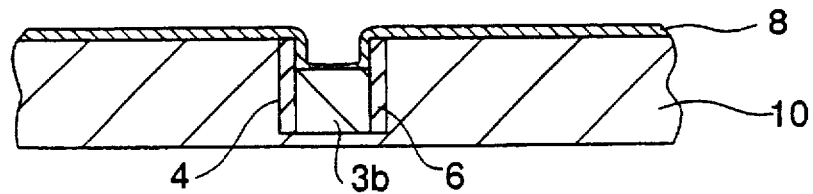
Figure 4:
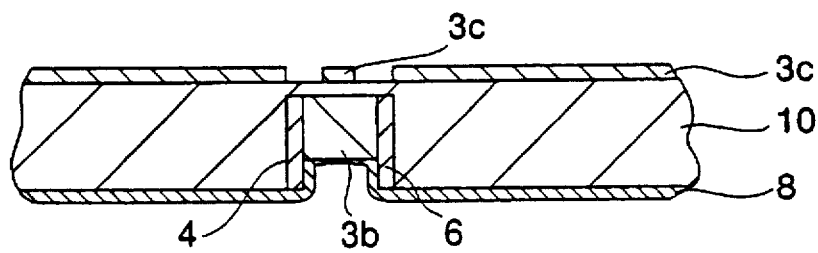
Figure 4:
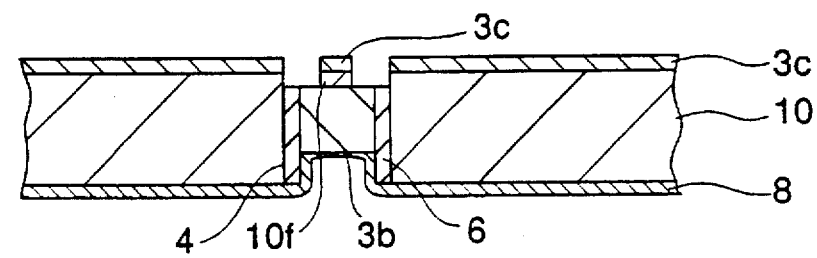
Figure 4:
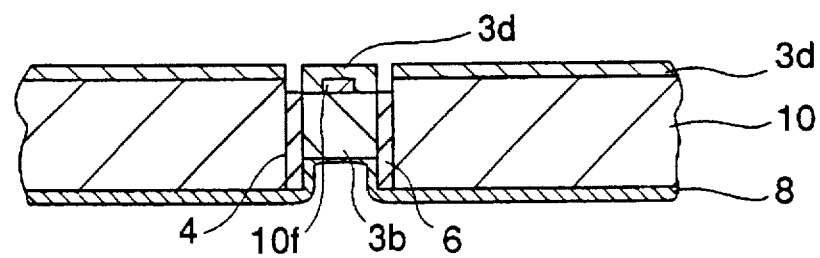
Figure 4:
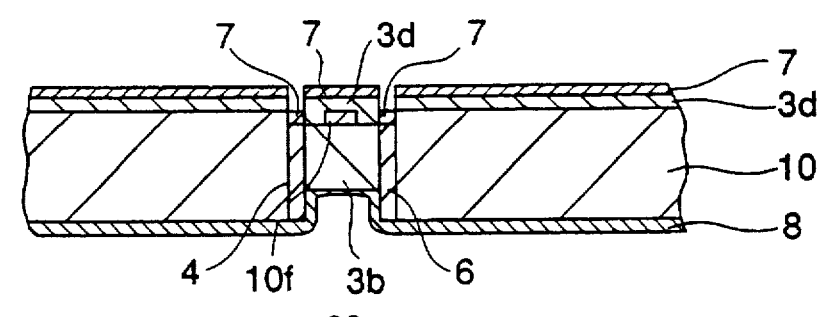
Figure 4:
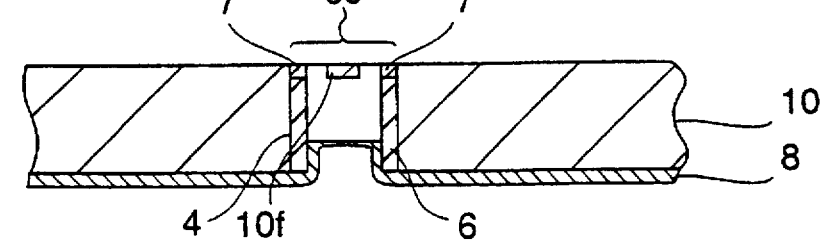

Thereafter, the substrate 10 is turned over, and a resist pattern 3c is formed on the rear surface of the substrate 10 (FIG. 4(b)).

In the step of FIG. 4(c), by anisotropic etching using the resist pattern 3c as a mask, a thin portion of the substrate 10 at the bottom of the hole 4 is selectively etched to form an overhanging portion 10f of the substrate 10.

After removal of the resist pattern 3c, a resist pattern 3d having an opening opposite the Au film 6 is formed on the rear surface of the substrate 10 (FIG. 4(d)).

In the step of FIG. 4(e), an Au film 7 is deposited over the rear surface of the substrate 10 by sputtering, and the resist pattern 3d and unnecessary portions of the Au film 7 on the resist pattern 3d are removed by the lift-off technique, followed by removal of the resist film 3b, resulting in the waveguide terminal structure 60 shown in FIG. 4(f). In FIG. 4(f), the hole 4 corresponds to the hole 10g of FIG. 1, and the Au films 6 and 7 and the plated Au film 8 correspond to the metallized layer 10h of FIG. 1.

The plated Au film 8 on the rear surface of the substrate 10 may be removed or used as a ground layer 10c of the microstrip line 10A (see FIG. 1).

A description is given of the operation.

At the input part of the IC chip, as shown in FIG. 2(a), the edge of the external waveguide 14 is connected to the metallized layer 10h of the waveguide terminal structure 60 of the IC chip. Microwave signals traveling through the waveguide 14 are applied to the waveguide terminal structure 60 and transmitted through the microstrip line 10A comprising the signal conductor 11 and the ground conductor 10c to the circuit elements (not shown) in the IC chip.

Likewise, at the output part of the IC chip, microwave signals output from the circuit elements are transmitted through a microstrip line and a waveguide terminal structure to an external waveguide.

In the microwave IC chip 100 according to the first embodiment of the present invention, input and output of microwave signals are easily carried out simply by applying the edge of the waveguide 14 to the waveguide terminal structure 60 on the front surface of the substrate 10. Therefore, even when the IC chip 100, i.e., the substrate 10, warps, the input and output of microwave signals are carried out with high stability. As a result, a highly-reliable evaluation of input-output characteristics of the IC chip is realized.

In addition, the microwave signals traveling through the external waveguide 14 are input to the microstrip line 10A of the IC chip 100, and the microwave signals transmitted through the microstrip line are output to the external waveguide. Therefore, the microwave signals are input to and output from the IC chip with no transmission loss between the IC chip and an external device. Consequently, the operating characteristics of the IC chip are significantly improved.

[Embodiment 2]

Figure 5:
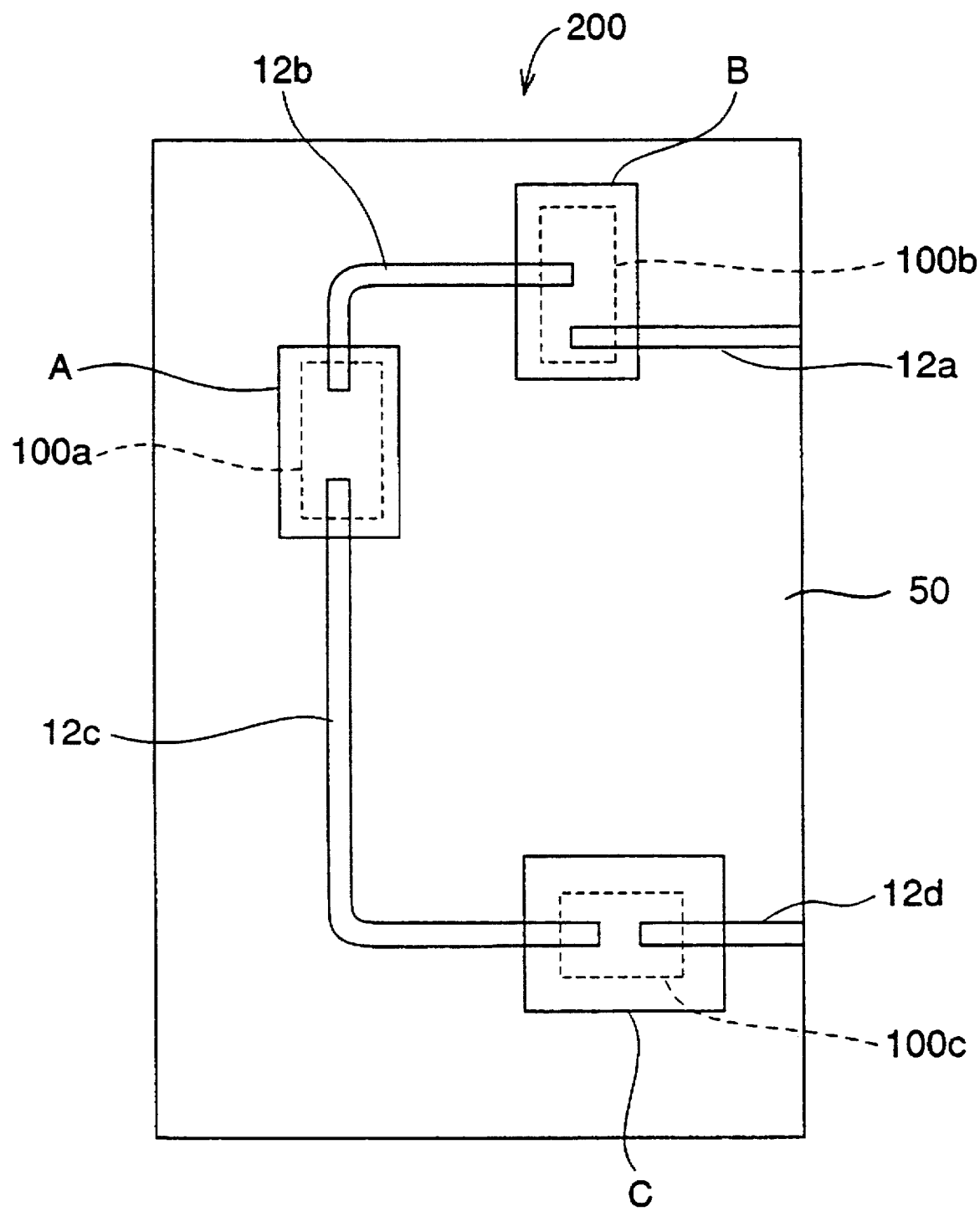
FIG. 5 is a plan view schematically illustrating a hybrid integrated circuit device in accordance with a second embodiment of the present invention.

FIG. 5 is a plan view schematically illustrating a hybrid IC device according to a second embodiment of the present invention. In the figure, the same reference numerals as in FIG. 1 designate the same or corresponding parts. A hybrid IC 200 comprises a mounting substrate 50, such as a glass-epoxy substrate, and a plurality of microwave IC packages A to C respectively containing microwave IC chips 100a to 100c having the same structure as the IC chip 100 according to the first embodiment of the invention. An end of a waveguide 12a transmitting microwave signals from an external signal generator (not shown) is connected to an input terminal (input side waveguide terminal structure) of the microwave IC chip 100b included in the package B. An end of a waveguide 12b is connected to an output terminal (output side waveguide terminal structure) of the microwave IC chip 100b, and the other end of the waveguide 12b is connected to an input terminal (input side waveguide terminal structure) of the microwave IC chip 100a included in the package A. An end of a waveguide 12c is connected to an output terminal (output side waveguide terminal structure) of the microwave IC chip 100a, and the other end of the waveguide 12c is connected to an input terminal (input side waveguide terminal structure) of the microwave IC chip 100c included in the package C. An end of a waveguide 12d is connected to an output terminal (output side waveguide terminal structure) of the microwave IC chip 100c, and the other end of the waveguide 12d is connected to an external device (not shown).

Figure 6:
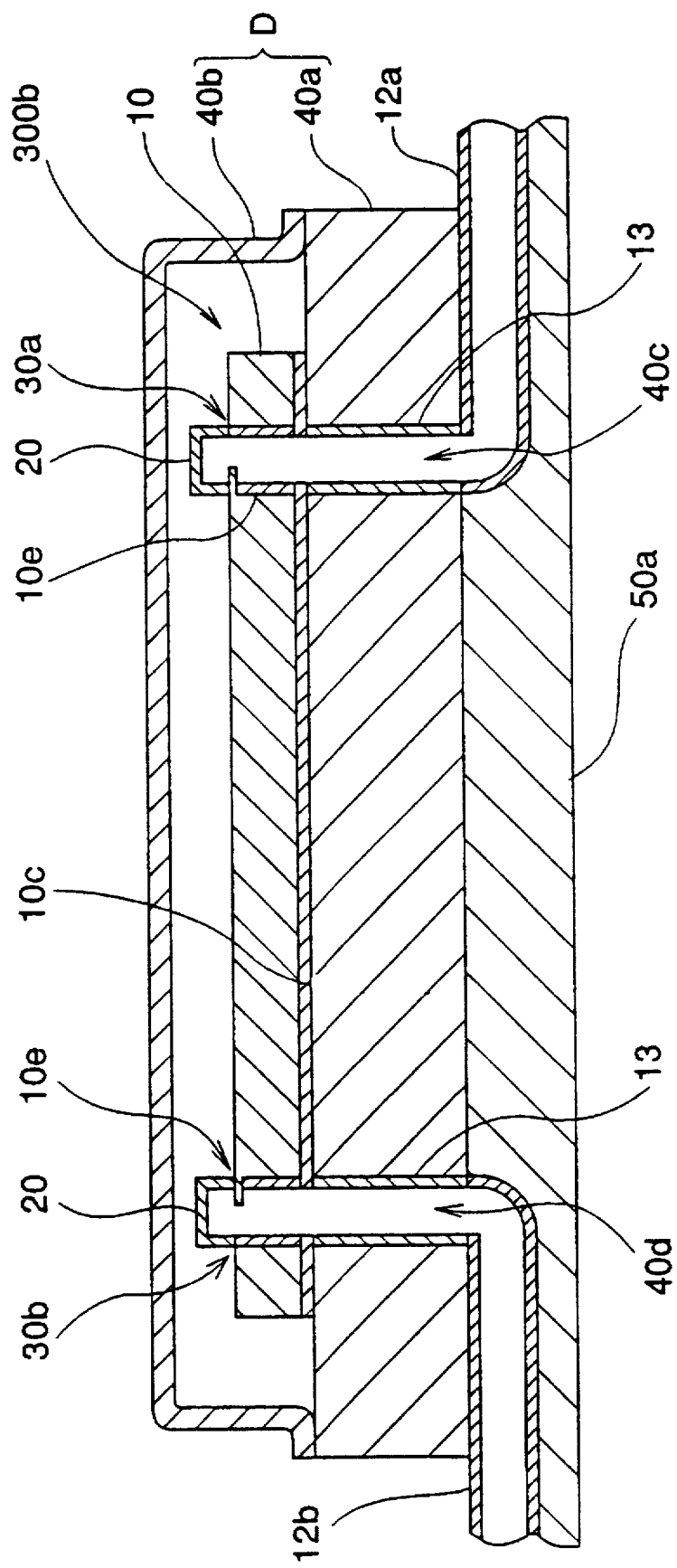
FIG. 6 is a sectional view illustrating an internal structure of an IC package B shown in FIG. 5.

FIG. 6 is a sectional view schematically illustrating an internal structure of the microwave IC package B. In the figure, the same reference numerals as in FIGS. 1 and 5 designate the same or corresponding parts. The IC package B comprises a ceramic substrate 40e on which the microwave IC chip 100b is disposed, and a lid 40f. The lid 40f has holes 40g and 40h through which end portions of the waveguides 12a and 12b are inserted, respectively. An end portion of the external waveguide 12a is inserted into the IC package B through the hole 40g in the lid 40f and connected to the metallized layer 10h of the input side waveguide terminal structure 60a of the IC chip 100b. On the other hand, an end portion of the waveguide 12b is inserted into the IC package B through the hole 40h in the lid 40f and connected to the metallized layer 10h of the output side waveguide terminal structure 60b of the IC chip 100b.

The IC packages A and C have the same internal structure as shown in FIG. 6.

A description is given of the operation.

Microwave signals generated in an external signal generator (not shown) are input to the input side waveguide terminal structure 60a of the IC chip 100b in the package B through the external waveguide 12a and transmitted through the microstrip line on the surface of the IC chip 100b to the circuit elements of the IC chip 100b. After prescribed processing in the IC chip 100b, the microwave signals are transmitted through the microstrip line on the surface of the IC chip 100b to the output side waveguide terminal structure 60b of the IC chip 100b and output to the waveguide 12b. Thereafter, the microwave signals travel through the microwave IC packages A and C in the same manner as described above. Finally, the microwave signals are output to an external device through the output side waveguide terminal structure of the IC chip 100c and the waveguide 12d.

In the hybrid IC 200 according to the second embodiment of the invention, it is not necessary to produce microwave transmission lines on the packages A to C and the mounting substrate 50. In addition, the hybrid IC 200 is assembled simply by inserting the end portions of the respective waveguides through the holes in the IC packages mounted on the mounting substrate 50. Therefore, the assembly of the hybrid IC is significantly simplified compared to the assembly of the conventional hybrid IC. Further, the transmission of microwave signals on the mounting substrate 50 is carried out by the microstrip lines and the waveguides. Therefore, mismatching of characteristic impedance in the device does not occur, so that transmission loss of microwave signals between the IC chips is reduced. Further, microwave signals from an external device are applied directly to the IC chip 100b through the waveguide 12a and, after prescribed processing in the IC chips, the microwave signals are output from the IC chip 100c directly to an external device through the waveguide 12d. Therefore, transmission loss of microwave signals between the hybrid IC 200 and external devices is reduced.

In the waveguide terminal structure of the microwave IC chip according to the first and second embodiments of the invention, the surface of the metallized layer that is a terminal surface of the structure is disposed in the substrate, and the distance between the signal conductor of the microstrip line and the surface of the metallized layer is equivalent to one-quarter of the wavelength of the microwave signal. Therefore, the thickness of the substrate 10 must be thicker than one-quarter of the wavelength of the microwave signal.

In a third embodiment of the invention described hereinafter, a microwave IC chip including a substrate thinner than one-quarter of the wavelength of the microwave signal is realized.

[Embodiment 3]

Figure 7:
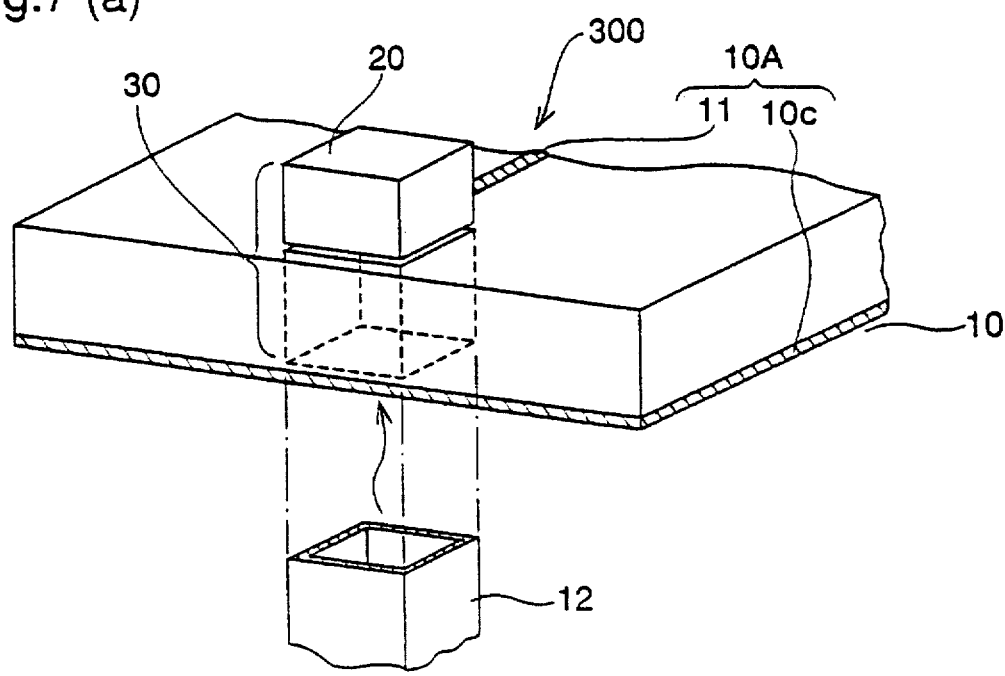
Figure 7:
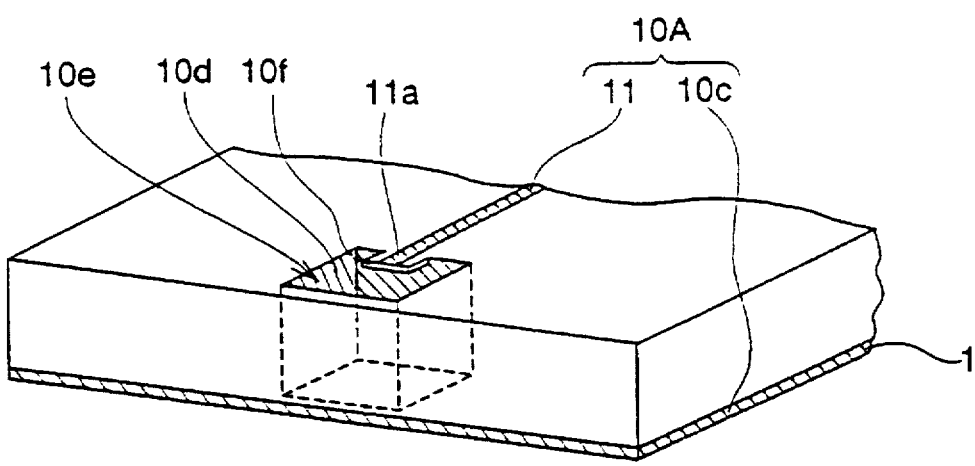
Figure 7:
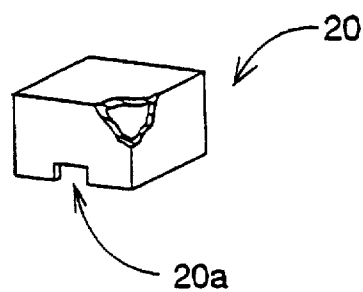

FIGS. 7(a)–7(c) are diagrams for explaining a structure of an input part of a microwave IC chip according to a third embodiment of the present invention. FIG. 7(a) is a perspective view illustrating the input part of the IC chip and an external waveguide, FIG. 7(b) is a perspective view of the input part where a metal cap is removed, and FIG. 7(c) is a perspective view illustrating the metal cap. In the figures, the same reference numerals as in FIGS. 1 and 2(a)–2(b) designate the same or corresponding parts. A microwave IC chip 300 includes a semiconductor substrate 10 comprising GaAs or the like and including a plurality of circuit elements (not shown). A microstrip line 10A comprises a signal conductor 11 disposed on the surface of the substrate 10 and a metallized ground conductor 10c disposed on the rear surface of the substrate 10. The microstrip line 10A transmits microwave signals to the circuit elements. A waveguide terminal structure 30 is located at a prescribed position in the substrate 10. The waveguide terminal structure 30 transmits microwave signals from an external waveguide 12 to the microstrip line 10A.

More specifically, the waveguide terminal structure 30 comprises a through-hole 10e formed at a prescribed position of the substrate 10, a portion 10f of the substrate 10 hanging over the through-hole 10e (hereinafter referred to as overhanging portion), a metallized layer 10d covering the inner surface of the hole 10e except the overhanging portion 10f, and a metal cap 20 disposed on the through-hole 10e and having a depth equivalent to a quarter of the wavelength of microwave signals traveling through the external waveguide 12. In this structure, the through-hole 10e and the metallized layer 10d make a body of the waveguide terminal structure, and the metal cap 20 makes one terminal surface of the waveguide terminal structure. More specifically, the internal upper surface of the metal cap 20 serves as the terminal surface. As shown in FIG. 7(c), the metal cap 20 has a notch 20a in its side wall. When the metal cap 20 is disposed on the through-hole 10e, the notch 20a is positioned above the end portion 11a of the signal conductor 11. That is, the edge of the metal cap 20 does not contact the signal conductor 11 but contacts the metallized layer 10d. The metal cap 20 is connected to the metallized layer 10d with solder or the like.

Although only the input part of the IC chip is described, an output part has the same structure as described above.

That is, a microstrip line for transmitting microwave signals output from the circuit elements is disposed on the surface of the substrate 10, and a waveguide terminal structure for transmitting the microwave signals traveling through the microstrip line to an external waveguide is connected to an end of the microstrip line.

FIGS. 8(a)–8(f) are sectional views illustrating a method of fabricating the waveguide terminal structure 30.

Figure 8:
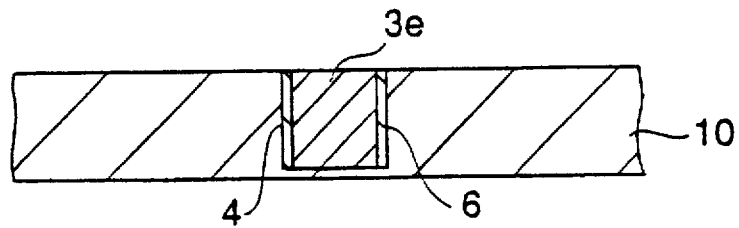
FIGS. 8(a)–8(f) are sectional views illustrating process steps in a method of fabricating a waveguide terminal structure of the microwave IC chip shown in FIG. 7(b).
Figure 8:
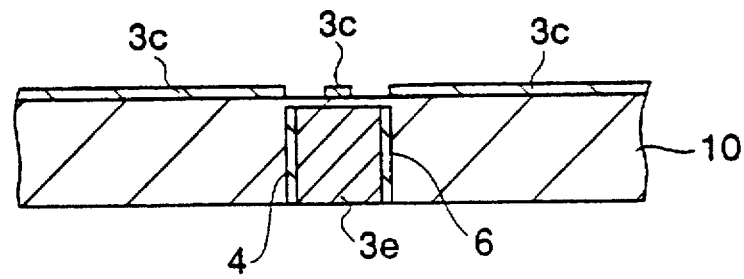
Figure 8:
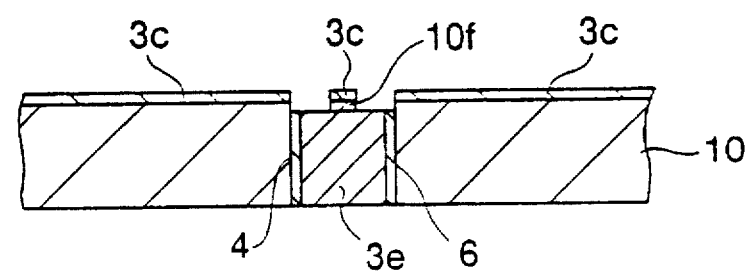
Figure 8:
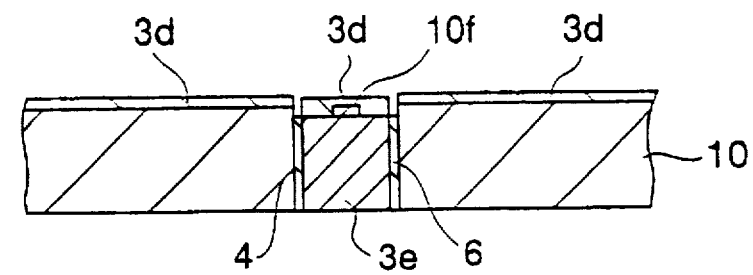
Figure 8:
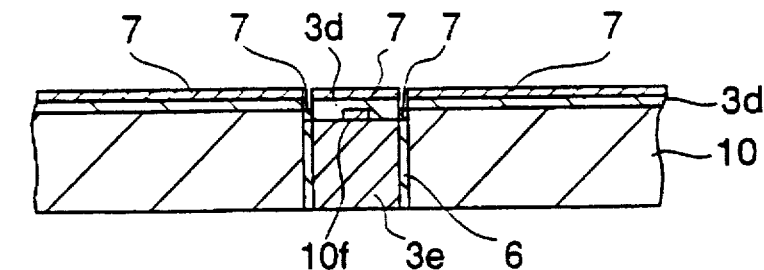
Figure 8:
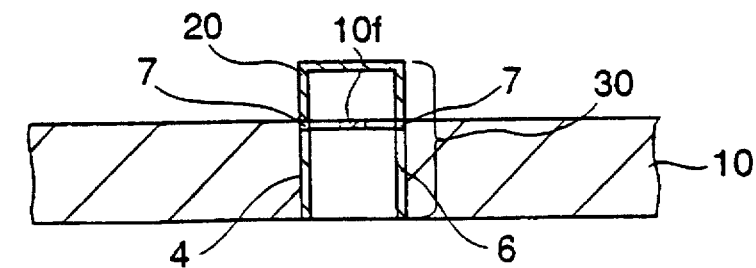

After process steps as described with respect to FIGS. 3(a)–3(f), the hole 4 is filled with a resist film 3e (FIG. 8(a)).

The substrate 10 is turned over, and a resist pattern 3c is formed on the rear surface of the substrate 10.

In the step of FIG. 8(c), using the resist pattern 3c as a mask, a thin portion of the substrate 10 at the bottom of the hole 4 is anisotropically etched to form an overhanging portion 10f of the substrate 10.

After removal of the resist pattern 3c, a resist pattern 3d having an opening opposite the Au film 6 is formed on the rear surface of the substrate (FIG. 8(d)).

Thereafter, an Au film 7 is formed by sputtering, and the resist pattern 3d and unnecessary portions of the Au film 7 on the resist pattern 3d are removed by the lift-off technique (FIG. 8(e)).

After removal of the resist film 3e (FIG. 8(f)), the metal cap 20 is connected to the Au film 7 with solder or the like, completing the waveguide terminal structure 30. The hole 4 corresponds to the hole 10e of FIG. 7(b), and the Au films 6 and 7 correspond to the metallized layer 10d of FIG. 10(b).

A description is given of the operation of the microwave IC chip 300.

As shown in FIG. 7(a), at the input part of the IC chip, the edge of the external waveguide 12 is connected to the metallized layer 10d of the waveguide terminal structure 30 at the rear surface of the substrate 10. Microwave signals traveling through the waveguide 12 are applied to the waveguide terminal structure 30 and transmitted through the microstrip line 10A comprising the signal conductor 11 and the ground conductor 10c to the circuit elements (not shown) in the IC chip.

Likewise, at the output part of the IC chip, microwave signals output from the circuit elements are transmitted through a microstrip line and a waveguide terminal structure to an external waveguide.

In the microwave IC chip 300 according to the third embodiment of the present invention, microwave signals from the outside are transmitted to the microstrip line of the IC chip simply by connecting the edge of the waveguide 12 to the waveguide terminal structure 30 at the rear surface of the substrate 10, and the microwave signals transmitted through the microstrip line are output to the outside. Therefore, the same effects as described in the first embodiment are achieved. In addition, the internal upper surface of the metal cap 20 serves as a terminal surface of the waveguide terminal structure 30, i.e., a metal surface spaced from the end portion 11a of the signal conductor 11 by one-quarter of the wavelength of the microwave signal. Therefore, it is not necessary to make the depth of the hole of the substrate larger than one-quarter of the wavelength of the microwave signals, whereby the thickness of the substrate 10 can be selected regardless of the wavelength of the microwave signals. As a result, the size of the device can be reduced.

In the microwave IC chip 300 according to the third embodiment of the invention, since the edge of the external waveguide 12 is connected to the waveguide terminal structure 30 at the rear surface of the substrate 10, input-output characteristic evaluation of the IC chip 300 is complicated as compared to the microwave IC chip 100 according to the first embodiment.

[Embodiment 4]

Figure 9:
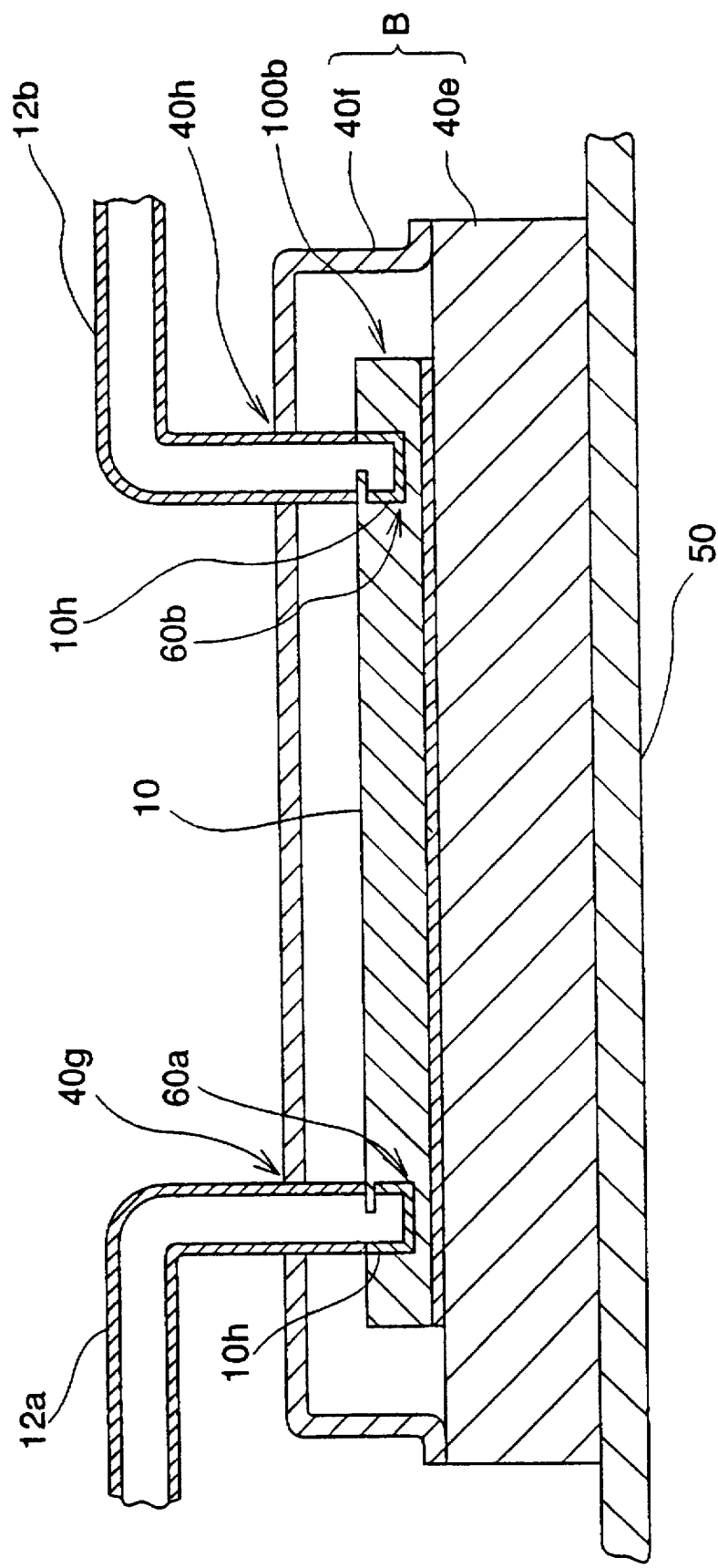
FIG. 9 is a sectional view illustrating a microwave IC chip mounted on a mounting substrate in a hybrid integrated circuit device in accordance with a fourth embodiment of the present invention.

FIG. 9 is a sectional view of a part of a hybrid IC device according to a fourth embodiment of the present invention. In the figure, the same reference numerals as in FIG. 6 designate the same or corresponding parts. Reference numeral 50a designates a mounting substrate, for example, a glass-epoxy substrate. An IC package D containing a microwave IC package 300b according to the third embodiment of the invention is mounted on the mounting substrate 50a. The package D comprises a ceramic substrate 40a on which the IC chip 300b is disposed, and a lid 40b. Through-holes 40c and 40d whose inner walls are coated with metallized layers 13 penetrate the ceramic substrate 40a. The through-hole 40c (40d) serves as a waveguide connecting a waveguide terminal structure 30a (30b) of the IC chip 300b to an end of a waveguide 12a (12b) embedded in the mounting substrate 50a. In this structure, the waveguide terminal structures 30a and 30b are located at an input part and an output part of the IC chip 300b, respectively.

Although only one microwave IC chip 300b is shown in FIG. 9, in the hybrid IC device according to this fourth embodiment, a plurality of microwave IC chips having the same structure as the IC chip 300b are mounted on the mounting substrate 50b, and the whole structure and the operation are identical to those of the hybrid IC device 200 shown in FIG. 5.

Also in the hybrid IC device according to the fourth embodiment of the invention, the same effects of the hybrid IC device 200 according to the second embodiment are achieved. Further, since the waveguides are embedded in the mounting substrate, the size of the device is reduced compared to the hybrid IC device 200 of the second embodiment. However, since grooves for embedding the waveguides are formed in the mounting substrate and the through-holes are formed in the ceramic substrate of the package, the assembly is complicated compared to the assembly according to the hybrid IC 200 of the second embodiment.

[Embodiment 5]

Figure 10:
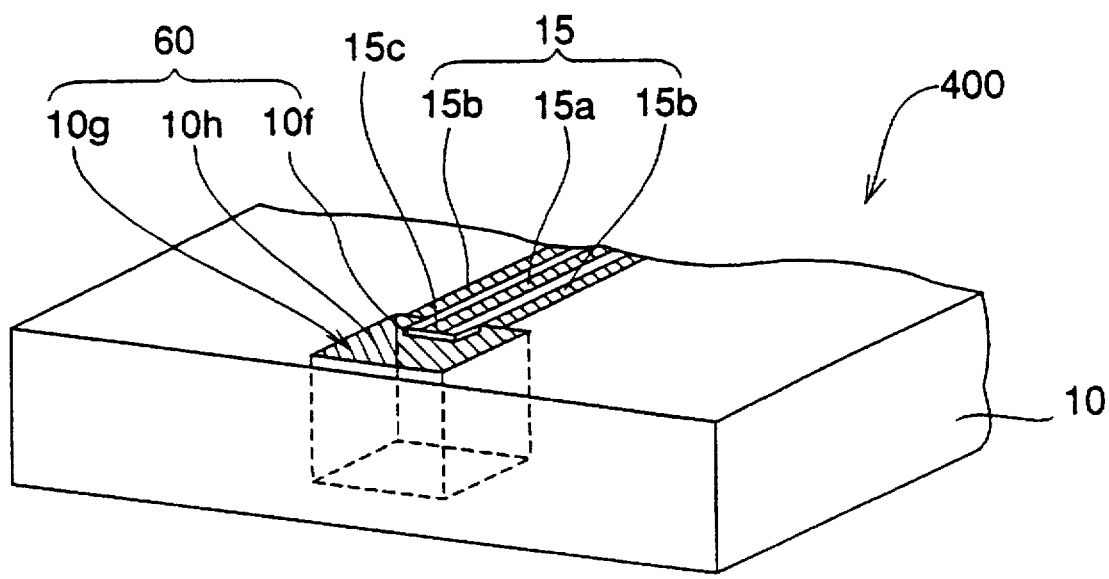
FIG. 10 is a perspective view illustrating an input part of a microwave IC chip in accordance with a fifth embodiment of the present invention.
Figure 11:
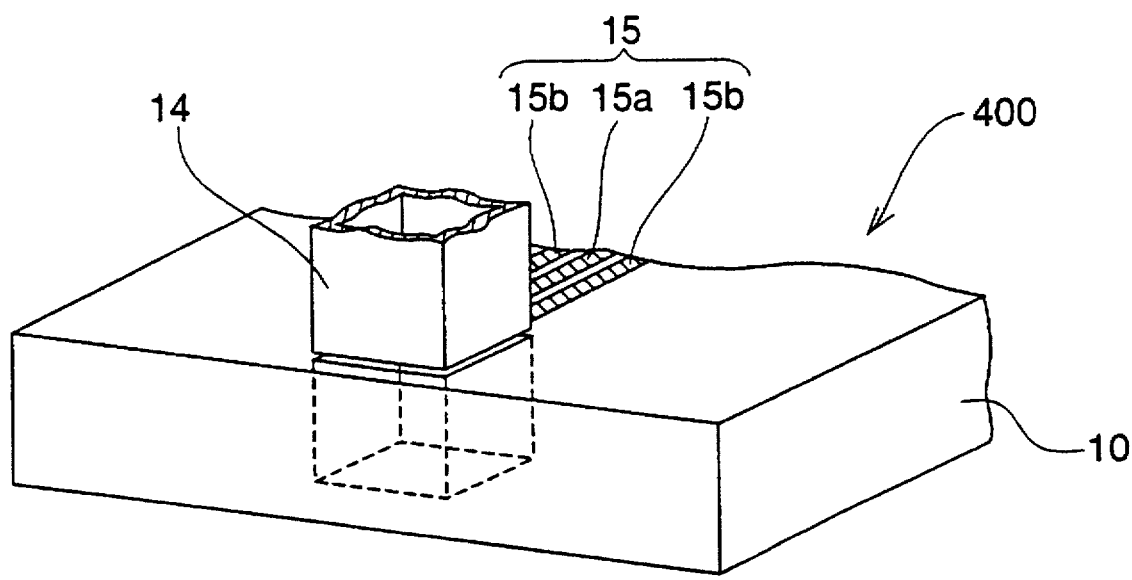
FIG. 11 is a perspective view of the input part of the microwave IC chip shown in FIG. 10 when microwave signals are applied to the input part from an external waveguide.

FIG. 10 is a perspective view illustrating an input part of a microwave IC chip according to a fifth embodiment of the present invention. FIG. 11 is a perspective view of the input part in a state where microwave signals are input from an external waveguide. In these figures, the same reference numerals as in FIGS. 1 and 2(a) designate the same or corresponding parts. A microwave IC chip 400 of this fifth embodiment is identical to the microwave IC chip 100 of the first embodiment except that a coplanar line 15 is employed in place of the microstrip line 10A. The coplanar line 15 comprises a signal conductor 15a and ground conductors 15b. The ground conductors 15b are connected to the metallized layer 10h of the waveguide terminal structure 60. When the external waveguide 14 is applied to the waveguide terminal structure 60 of the IC chip 400, the notch 14a (see FIG. 2(b)) of the waveguide 14 is positioned above the end portion 15c of the signal conductor 15a. That is, the edge of the external waveguide 14 does not contact the signal conductor 15a but contacts the metallized layer 10h in the hole 10g.

Although only the input part is described, an output part of the IC chip 400 has the same structure as described above.

Also in the microwave IC chip 400 according to the fifth embodiment of the invention, the same operation and effect as those of the IC chip 100 of the first embodiment are realized. In the microwave IC chip 100 according to the first embodiment, since the microstrip line 10A is employed as the microwave transmission line on the substrate, characteristic impedance of the microstrip line 10A is adjusted to 50 Ω by both the width of that line and the thickness of the substrate. On the other hand, in the IC chip 400 according to this fifth embodiment, since the coplanar line 15 is employed as the microwave transmission line, characteristic impedance of the microwave transmission line can be adjusted to 50 Ω by adjusting only the width of the coplanar line 15. That is, the thickness of the substrate is selected regardless of the characteristic impedance of the microwave transmission line, whereby the size of the device is reduced.

[Embodiment 6]

Figure 12:
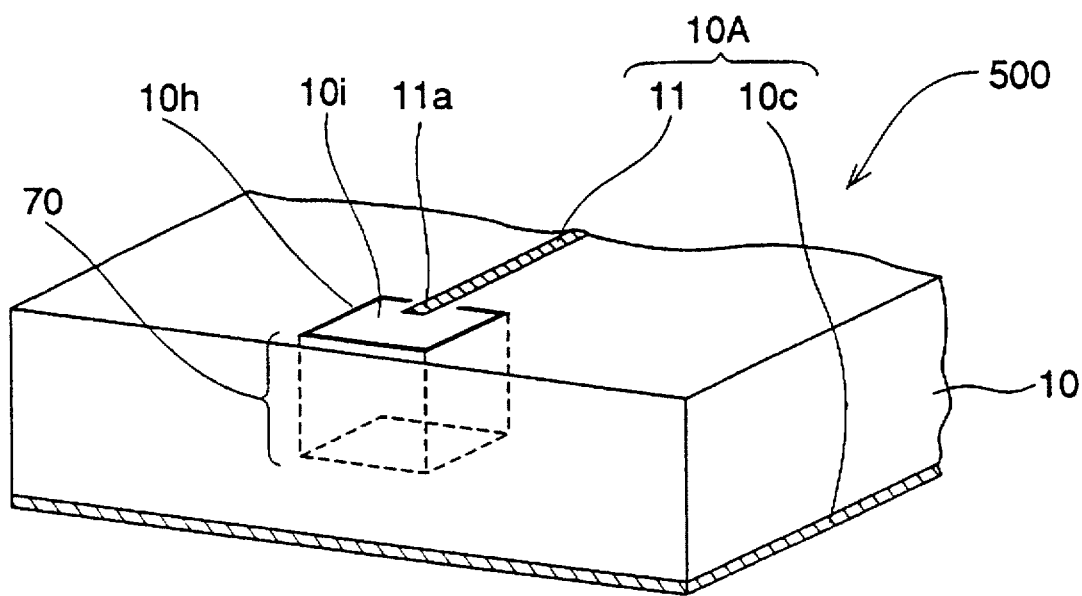
FIG. 12(a) is a perspective view illustrating an input part of a microwave IC chip in accordance with a fifth embodiment of the present invention.
FIG. 12(b) is a perspective view illustrating the input part when microwave signals are applied to the input part from an external waveguide.
Figure 12:
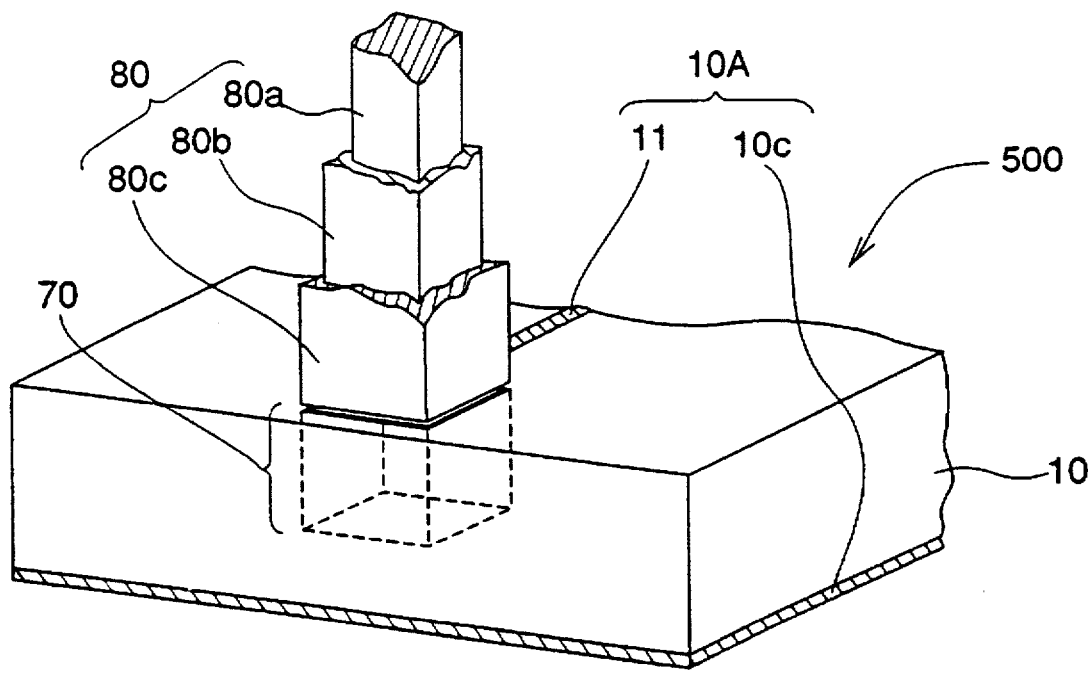
Figure 13:
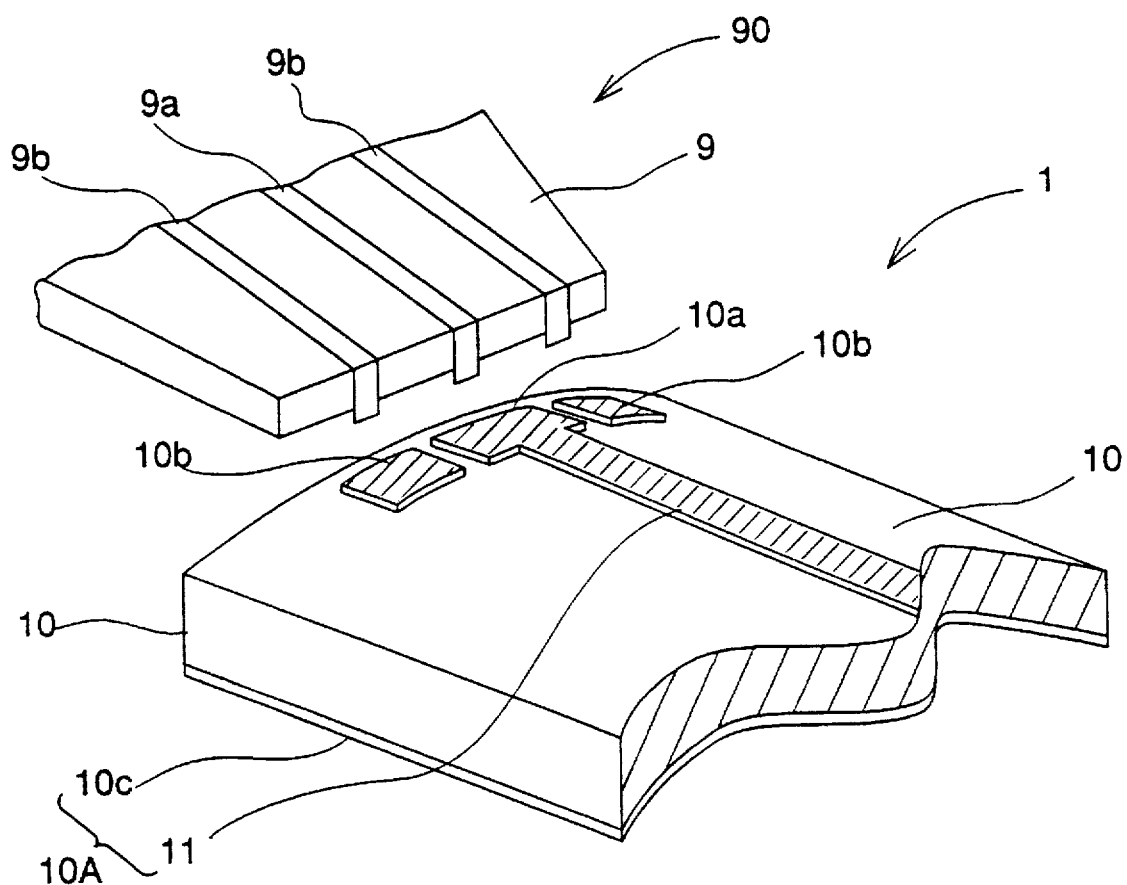
FIG. 13 is a perspective view for explaining an input-output evaluation for a conventional microwave IC chip, schematically illustrating an input part of the microwave IC chip and a coplanar type prober.

FIG. 12(a) is a perspective view illustrating an input part of a microwave IC chip according to a sixth embodiment of the present invention, and FIG. 12(b) is a perspective view of the input part in a state where microwave signals are input from an external dielectric waveguide. In the figures, the same reference numerals as in FIG. 1 designate the same or corresponding parts. A microwave IC chip 500 of this sixth embodiment is fundamentally identical to the microwave IC chip 100 of the first embodiment except that the space surrounded by the metallized layer 10h in the waveguide terminal structure 60 is filled with a GaAs layer 10i to form a dielectric waveguide terminal structure 70. Reference numeral 80 designates an external dielectric waveguide comprising a first dielectric line (core) 80a having a dielectric constant equal to the dielectric constant of the GaAs layer, a second dielectric line (clad) 80b surrounding the first dielectric line 80a and having a dielectric constant smaller than the dielectric constant of the first dielectric line 80a, and a ground metal film 80c coating the second dielectric line 80b.

A description is given of the operation.

As shown in FIG. 12(b), at the input part of the IC chip 500, the external dielectric waveguide 80 is connected to the dielectric waveguide terminal structure 70 so that the first and second dielectric lines 80a and 80b contact the GaAs layer 10i and the ground metal film 80c contacts the metallized layer 10h of the dielectric waveguide terminal structure 70. Then, microwave signals traveling through the external dielectric waveguide 80 are transmitted to the dielectric waveguide terminal structure 70 of the IC chip 500. Thereafter, the microwave signals are output from the end portion 11a of the signal conductor 11 of the dielectric waveguide terminal structure 70 and transmitted through the microstrip line 10A comprising the signal conductor 11 and the metallized ground layer 10c to circuit elements (not shown) in the IC chip.

Likewise, at an output part of the IC chip, microwave signals output from the circuit elements are transmitted through a microstrip line and a dielectric waveguide terminal structure to an external dielectric waveguide.

While in the microwave IC chip according to the above-described first embodiment microwave signals travel through the space in the waveguide terminal structure 60, i.e., in vacuum, in the microwave IC chip according to this sixth embodiment microwave signals travel through a solid dielectric material, i.e., the GaAs layer 10i. Assuming that the dielectric constant of vacuum is $\epsilon_0$ and the dielectric constant of GaAs is $\epsilon$, the wavelength of the microwave signal in the dielectric waveguide terminal structure 70 of the IC chip 500 is reduced by $\epsilon_0/\epsilon$ compared to that of the waveguide terminal structure 60 of the IC chip 100 according to the first embodiment. Therefore, the height of the dielectric waveguide terminal structure 70 in the direction perpendicular to the surface of the substrate 10, i.e., the thickness of the GaAs layer 10i, is reduced by $\epsilon_0/\epsilon$ compared to the height of the waveguide terminal structure 60 of the IC chip 100 in the direction perpendicular to the surface of the substrate 10. Accordingly, in the microwave IC chip 500 of this sixth embodiment, the same effects as described with respect to the first embodiment are attained. In addition, since the size of the dielectric waveguide terminal structure 70 of the IC chip 500 is smaller than the size of the waveguide terminal structure 60 of the IC chip 100, the chip size is reduced.

[Embodiment 7]

According to a seventh embodiment of the present invention, the microstrip line of the microwave IC chip 300 according to the above-described third embodiment is replaced with a coplanar line. In this case, since the thickness of the substrate 10 can be selected regardless of the wavelength of the microwave signals and the characteristic impedance of the microwave transmission line, the chip size is significantly reduced compared to the microwave IC chip 300 according to the third embodiment.

[Embodiment 8]

According to an eight embodiment of the present invention, the microstrip line of the microwave IC chip 500 of the above-described sixth embodiment is replaced with a coplanar line. Also in this device, the same effects as described in the sixth embodiment are achieved. In addition, since the thickness of the substrate can be selected regardless of the characteristic impedance of the microwave transmission line, the size of the chip is significantly reduced compared to the microwave IC chip 500 according to the sixth embodiment.

[Embodiment 9]

According to a ninth embodiment of the present invention, a hybrid IC device includes a plurality of microwave semiconductor IC chips 500 according to the sixth embodiment of the present invention. More specifically, the microwave semiconductor IC chips are respectively contained in packages as described in the second embodiment of the invention and the IC packages are mounted on a mounting substrate. Further, the dielectric waveguide terminal structures of the respective microwave semiconductor IC chips are connected to each other with a plurality of dielectric waveguides. In this structure, the same effects as those of the hybrid IC device 200 according to the second embodiment are achieved.

In the present invention, a hybrid IC device similar to the hybrid IC device 200 of the second embodiment can be made using the microwave semiconductor IC chips according to the fifth embodiment of the invention.

What is claimed is:

1. A semiconductor device comprising:

a semiconductor substrate having opposite front and rear surfaces and including a microwave semiconductor element;

a microwave transmission line, including a signal conductor, disposed on the front surface of the semiconductor substrate and electrically connected to the microwave semiconductor element; and a waveguide terminal structure located partially on the front surface of the semiconductor substrate and including a terminal surface disposed within the semiconductor substrate for connection to an end of an external waveguide wherein the signal conductor of the microwave transmission line has an end extending into the waveguide terminal structure.

2. The semiconductor device of claim 1 wherein said waveguide terminal structure is connected to an end of an external waveguide that is applied to the semiconductor substrate at the front surface of the semiconductor substrate.

3. The semiconductor device of claim 1 wherein said waveguide terminal structure comprises:

a waveguide terminal body disposed within the substrate for connection to an external waveguide applied to the rear surface of the substrate; and a terminal surface part comprising a material different from the substrate and disposed on the front surface of the substrate.

4. The semiconductor device of claim 1 wherein said waveguide terminal structure is a dielectric waveguide terminal structure including a dielectric layer to be connected to an end of an external dielectric waveguide.

5. The semiconductor device of claim 1 wherein said microwave transmission line is a coplanar-type transmission line.

6. A hybrid integrated circuit device comprising:

a mounting substrate;

a plurality of semiconductor chips respectively contained in respective packages and mounted on the mounting substrate, each semiconductor chip including:

a semiconductor substrate having opposite front and rear surfaces and including a microwave semiconductor device, input and output side microwave transmission lines, each of the transmission lines having a signal conductor disposed on the respective semiconductor substrate and electrically connected to the microwave semiconductor device in the respective semiconductor substrate, and input and output side waveguide terminal structures disposed in the respective semiconductor substrate, the signal conductors of the input and output side microwave transmission lines having ends included in the input and output side waveguide terminal structures, respectively; and a plurality of waveguides connecting the semiconductor chips with each other for transmitting microwave signals between the semiconductor chips, each waveguide connecting the output side waveguide terminal structure of one semiconductor chip to the input side waveguide terminal structure of another semiconductor chip.

7. The hybrid integrated circuit device of claim 6 wherein said semiconductor chips include an input side chip and an output side chip respectively constituting an input part and an output part of the whole device, the input side waveguide terminal structure of the input side chip is connected to an end of a first external waveguide, the output side waveguide terminal structure of the output side chip is connected to an end of a second external waveguide, and opposite ends of the first and second external waveguides are connected to external devices.

8. The hybrid integrated circuit device of claim 7 wherein each of the waveguide terminal structures of the respective semiconductor chips is located in the semiconductor substrate for connection to a waveguide at the front surface of the semiconductor substrate and has a terminal surface positioned within the semiconductor substrate and including a waveguide inserted into the IC package through a hole in a lid of the IC package and connected to the waveguide terminal structure of the semiconductor chip.

9. The hybrid integrated circuit device of claim 7 wherein each of the waveguide terminal structures of the respective semiconductor chips comprises a body located in the semiconductor substrate for connection to a waveguide at the rear surface of the semiconductor substrate and a terminal surface part different from the semiconductor substrate and disposed on the front surface of the semiconductor substrate and including a waveguide embedded in the mounting substrate penetrating a package substrate on which the semiconductor chip is mounted and connected to the waveguide terminal structure.

10. The hybrid integrated circuit device of claim 7 wherein each of the waveguide terminal structures includes a dielectric layer.

11. The hybrid integrated circuit device of claim 6 wherein each of the waveguide terminal structures of the respective semiconductor chips is located in the semiconductor substrate for connection to a waveguide at the front surface of the semiconductor substrate and has a terminal surface positioned within the semiconductor substrate and including a waveguide inserted into the IC package through a hole in a lid of the IC package and connected to the waveguide terminal structure of the semiconductor chip.

12. The hybrid integrated circuit device of claim 6 wherein each of the waveguide terminal structures of the respective semiconductor chips comprises a body located in the semiconductor substrate for connection to a waveguide at the rear surface of the semiconductor substrate and a terminal surface part different from the semiconductor substrate and disposed on the front surface of the semiconductor substrate and including a waveguide embedded in the mounting substrate penetrating a package substrate on which the semiconductor chip is mounted and connected to the waveguide terminal structure.

13. The hybrid integrated circuit device of claim 6 wherein each of the waveguide terminal structures includes a dielectric layer.

* * * * *